United States Patent
Murakami et al.

(10) Patent No.: US 9,472,394 B2
(45) Date of Patent: Oct. 18, 2016

(54) METHOD OF FORMING SILICON OXIDE FILM

(71) Applicant: TOKYO ELECTRON LIMITED, Tokyo (JP)

(72) Inventors: Hiroki Murakami, Nirasaki (JP); Toshiyuki Ikeuchi, Nirasaki (JP); Jun Sato, Oshu (JP); Yuichiro Morozumi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/154,341

(22) Filed: Jan. 14, 2014

(65) Prior Publication Data

US 2014/0199853 A1    Jul. 17, 2014

(30) Foreign Application Priority Data

Jan. 16, 2013    (JP) .................................. 2013-005743

(51) Int. Cl.
| | | |
|---|---|---|
| H01L 21/302 | (2006.01) | |
| H01L 21/02 | (2006.01) | |
| H01L 21/321 | (2006.01) | |
| H01L 21/677 | (2006.01) | |

(52) U.S. Cl.
CPC ... H01L 21/02238 (2013.01); H01L 21/02164 (2013.01); H01L 21/02252 (2013.01); H01L 21/02255 (2013.01); H01L 21/32105 (2013.01); H01L 21/67757 (2013.01)

(58) Field of Classification Search
CPC .................. H01L 21/31658; H01L 21/02249; H01L 21/02255; H01L 21/0223

USPC ............................................. 438/770
See application file for complete search history.

(56) References Cited

U.S. PATENT DOCUMENTS

| | | | | |
|---|---|---|---|---|
| 6,037,670 | A | * | 3/2000 | Ohtaka .......................... 257/797 |
| 7,851,383 | B2 | * | 12/2010 | Yu ..................... H01L 21/28202 438/431 |
| 2006/0046512 | A1 | * | 3/2006 | Nakamura ......... B23K 26/0661 438/770 |
| 2010/0301336 | A1 | * | 12/2010 | Babich et al. ................... 257/57 |
| 2011/0053342 | A1 | * | 3/2011 | Khalid ........................... 438/455 |
| 2011/0312192 | A1 | * | 12/2011 | Murakami et al. ............. 438/787 |
| 2012/0164327 | A1 | * | 6/2012 | Sato et al. ................. 427/248.1 |

FOREIGN PATENT DOCUMENTS

| | | |
|---|---|---|
| JP | 60-210878 A | 10/1985 |
| JP | 61-152043 A | 7/1986 |
| JP | 62-166527 A | 7/1987 |
| JP | 8-78403 A | 3/1996 |
| JP | 2003-297822 A | 10/2003 |
| JP | 2006-66587 A | 3/2006 |
| JP | 2006-190787 A | 7/2006 |

* cited by examiner

*Primary Examiner* — Julia Slutsker
(74) *Attorney, Agent, or Firm* — Nath, Goldberg & Meyer; Jerald L. Meyer

(57) ABSTRACT

A method of forming a silicon oxide film includes forming a silicon film on a base, the base being a surface to be processed of an object to be processed, and forming a silicon oxide film on the base by oxidizing the silicon film. Between the forming a silicon film and the forming a silicon oxide film, exposing the object to be processed having the silicon film formed thereon to an atmosphere containing at least an oxidizing component is performed.

13 Claims, 8 Drawing Sheets

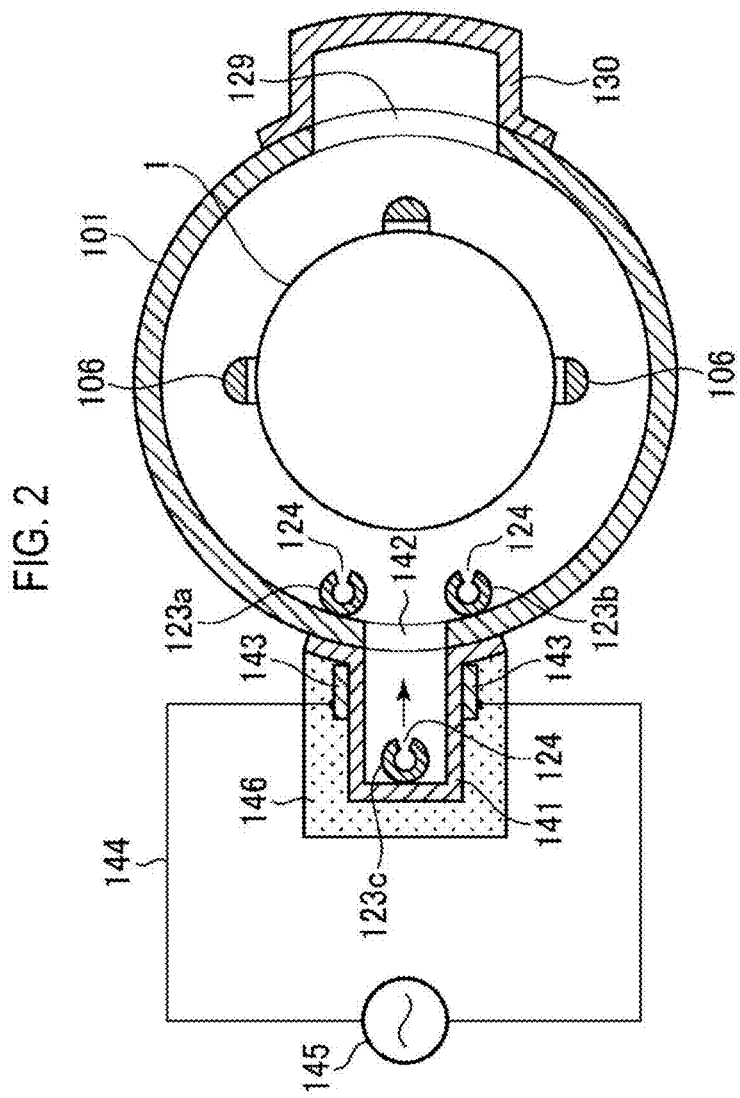

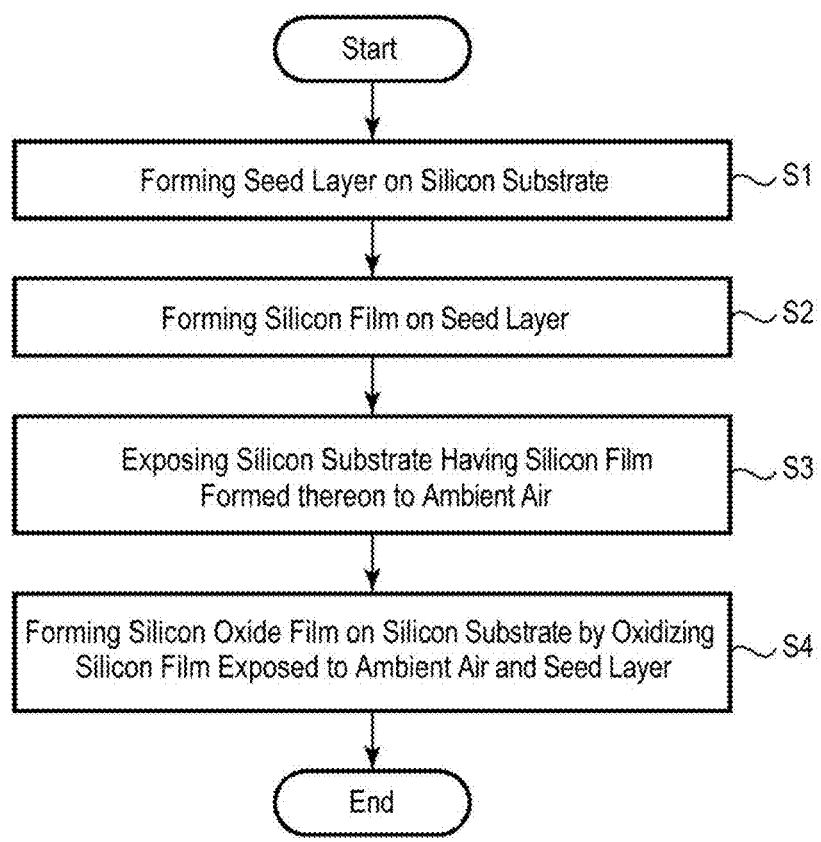

Formation of Silicon Film→Subsequent Oxidization in Same
Processing Chamber
(Reference Example)

Formation of Silicon Film→Exposure to Ambient Air
→Oxidization
(Embodiment)

METHOD OF FORMING SILICON OXIDE FILM

CROSS-REFERENCE TO RELATED APPLICATION

This application claims the benefit of Japanese Patent Application No. 2013-005743, filed on Jan. 16, 2013, in the Japan Patent Office, the disclosure of which is incorporated herein in its entirety by reference.

TECHNICAL FIELD

The present disclosure relates to a method of forming a silicon oxide film.

BACKGROUND

Recently, semiconductor integrated circuit devices have been miniaturized. As the miniaturization proceeds, various thin films used in the semiconductor integrated circuit devices are required to be further thinned and to have better film quality.

For example, a related art discloses a method of forming an insulating film, such as a oxide film.

For further thinning of a film, it is important to improve a surface roughness of the thin film. This is because it is difficult to obtain a thin film having a uniform film thickness when there is poor surface roughness.

In addition, as a new problem in the thin film, it has also been important to improve interface roughness with a base. If the interface roughness is poor, interface states occur in an interface between the base and the thin film, and thus, mobility of electrons or holes may deteriorate or electrical charges may be trapped.

A related art discloses formation of a thin oxide film or an improvement of electrical characteristics of the thin oxide film, but does not disclose improvements of surface roughness and interface roughness.

SUMMARY

Some embodiments of the present disclosure provide a method of forming a silicon oxide film, which enables to obtain a silicon oxide film having satisfactory interface roughness.

According to one embodiment of the present disclosure, a method of forming a silicon oxide film includes forming a silicon film on a base, the base being a surface to be processed of an object to be processed, and forming a silicon oxide film on the base by oxidizing the silicon film, wherein between the forming a silicon film and the forming a silicon oxide film, exposing the object to be processed having the silicon film formed thereon to an atmosphere containing at least an oxidizing component is performed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a horizontal sectional view of the film forming apparatus shown in FIG. 1.

FIG. 3 is a flowchart showing an example of the method of forming a silicon oxide film according to the embodiment of the present disclosure.

DETAILED DESCRIPTION

Figure 1:
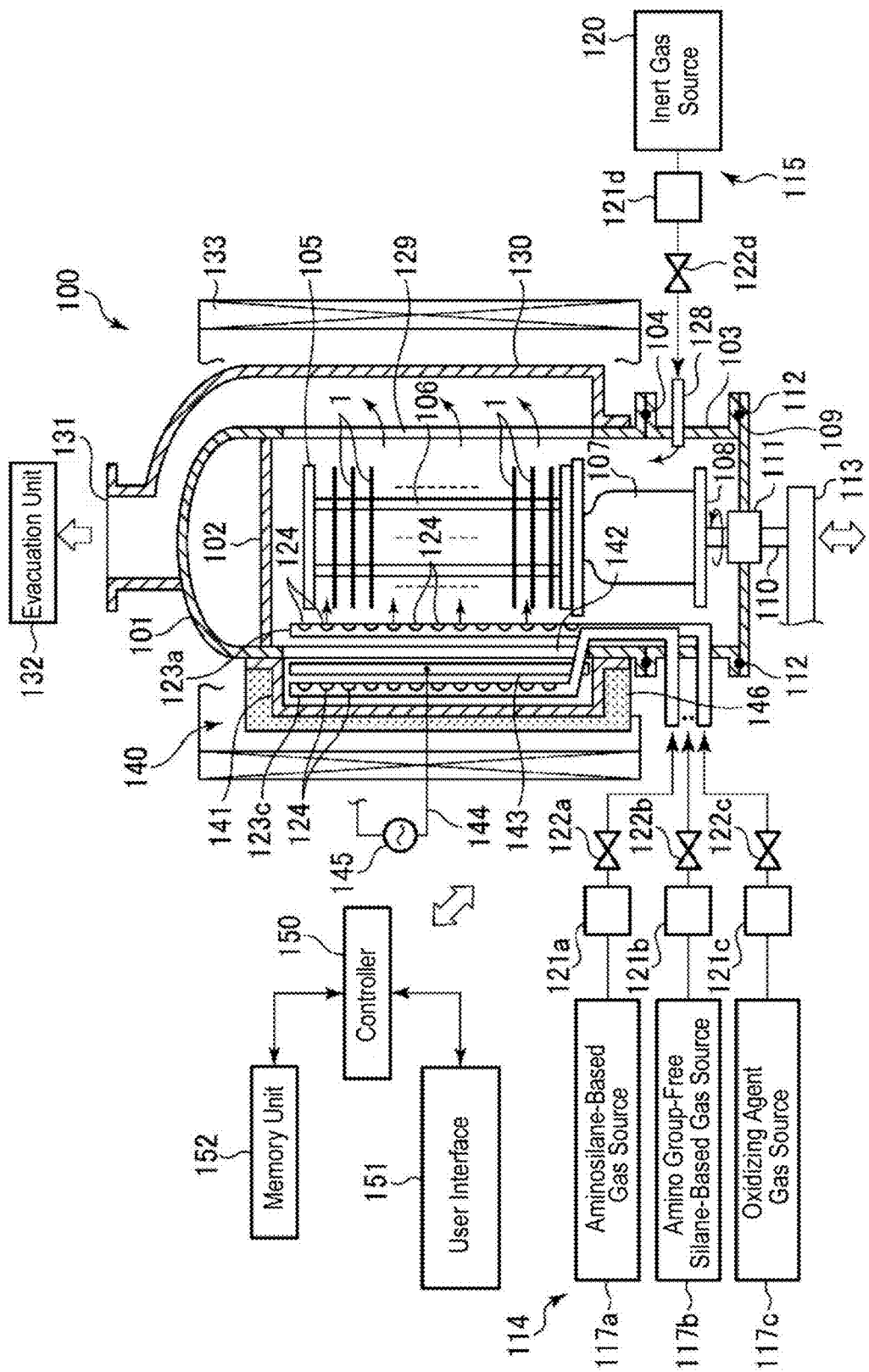
FIG. 1 is a longitudinal sectional view schematically showing an example of a film forming apparatus, in which a method of forming a silicon oxide film according to an embodiment of the present disclosure can be performed.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In addition, throughout the drawings, like reference numerals are used to designate like elements.

First, an example of a film forming apparatus, in which a method of forming a silicon oxide film according to an embodiment of the present disclosure can be performed, is described.

(Film Forming Apparatus)

FIG. 1 is a longitudinal sectional view schematically showing an example of a film forming apparatus, in which a method of forming a silicon oxide film according to an embodiment of the present disclosure can be performed, and FIG. 2 is a horizontal sectional view of the film forming apparatus shown in FIG. 1.

As shown in FIGS. 1 and 2, a film forming apparatus 100 includes a cylindrical processing chamber 101 having an open lower end and a ceiling. The processing chamber 101 is generally formed, for example, of quartz. A quartz ceiling plate 102 is installed at the ceiling in the processing chamber 101. A manifold 103, which, for example, is formed of stainless steel in the shape of a cylinder, is connected to the opening of the lower end of the processing chamber 101 through a sealing member 104 such as an O-ring.

The manifold 103 supports the lower end of the processing chamber 101. A vertical type wafer boat 105 is inserted into the processing chamber 101 from below the manifold 103. The vertical type wafer boat 105 has a plurality of rods 106, which are formed with a plurality of support grooves (not shown), and the support grooves partially support the peripheries of plural sheets, for example, 50 to 100 sheets of semiconductor substrates as objects to be processed, silicon substrates 1 in the example. Accordingly, the silicon substrates 1 are loaded in the vertical type wafer boat 105 in a multistage manner.

The vertical type wafer boat 105 is loaded on a table 108 through a thermal insulation container 107 made of quartz. The table 108 is supported on a rotating shaft 110, which extends through a lid portion 109 for opening and closing a lower end of the manifold 103, wherein the lid portion 109 is made, for example, of stainless steel. The portion through which the rotating shaft 110 extends is fitted with, e.g., a magnetic fluid seal 111 and airtightly seals and rotatably supports the rotating shaft 110. A sealing member 112 such as an O-ring is interposed and installed between a periphery of the lid portion 109 and the lower end of the manifold 103. Accordingly, the processing chamber 101 is maintained sealed. The rotating shaft 110 is mounted to a leading end of an arm 113 supported by a lift unit (not shown) such as a boat elevator. Accordingly, the vertical type wafer boat 105, the lid portion 109, and the like are moved up or down together to be inserted into or to be separated from the processing chamber 101.

The film forming apparatus 100 has a processing gas supply unit 114 for supplying the processing chamber 101 with gases used in processing, and an inert gas supply unit 115 for supplying the processing chamber 101 with an inert gas.

The processing gas supply unit 114 of the example includes an aminosilane-based gas source 117a, an amino group-free silane-based gas source 117b (hereinafter, abbreviated to silane-based gas source 117b) and an oxidizing agent gas source 117c. In addition, the inert gas supply unit 115 includes an inert gas source 120.

An aminosilane-based gas supplied from the aminosilane-based gas source 117a is used in forming a seed layer described later, and an example thereof is diisopropylaminosilane (DIPAS). An amino group-free silane-based gas supplied from the silane-based gas source 117b is used in forming a silicon film also described later, and an example thereof is disilane ($Si_2H_6$). An oxidizing agent gas supplied from the oxidizing agent gas source 117c is used in oxidation of a silicon film also described later, and an example thereof is a mixed gas of oxygen ($O_2$) and hydrogen ($H_2$). An inert gas supplied from the inert gas source 120 is used in dilution of the gas supplied into the processing chamber 101, purging the processing chamber 101, and the like, and an example thereof is nitrogen ($N_2$) gas.

The aminosilane-based gas source 117a is connected to a dispersion nozzle 123a via a flow rate controller 121a and an opening/closing valve 122a. In the same way, the silane-based gas source 117b is connected to a dispersion nozzle 123b (not shown in FIG. 1, but see FIG. 2) via a flow rate controller 121b and an opening/closing valve 122b. In the same way, the oxidizing agent gas source 117c is connected to a dispersion nozzle 123c via a flow rate controller 121c and an opening/closing valve 122c.

The dispersion nozzles 123a to 123c, which are made of quartz tubes, extends through a sidewall of the manifold 103 inwards, bend upwards and extend vertically. Each vertical portion of the dispersion nozzles 123a to 123c has a plurality of gas ejection holes 124 formed to be spaced apart from each other at a predetermined interval. Accordingly, each gas is ejected approximately uniformly from the gas ejection holes 124 toward the inside of the processing chamber 101 in the horizontal direction.

The processing chamber 101 has a plasma generation unit 140 formed in a portion of a sidewall thereof. The plasma generation unit 140 is provided with a plasma compartment wall 141 airtightly welded to an outer wall of the processing chamber 101. The plasma compartment wall 141 is made, for example, of quartz. The plasma compartment wall 141 has a cross section in a concave shape and covers an opening 142 formed in the sidewall of the processing chamber 101. The opening 142 is formed, for example, by cutting the sidewall of the processing chamber 101 off in the vertical direction in order to vertically cover all the silicon substrates 1 supported by the vertical type wafer boat 105. In the example, the dispersion nozzle 123c for ejecting an oxidizing agent gas is disposed in an internal space, i.e., a plasma generation space, defined by the plasma compartment wall 141.

The plasma generation unit 140 is provided with a pair of elongated plasma electrodes 143 arranged opposite to each other in the vertical direction on outer surfaces of both sidewalls of the plasma compartment wall 141, and a high frequency power supply 145, which for example, is connected to the pair of plasma electrodes 143 through feed lines 144 and supplies the pair of plasma electrodes 143 with high frequency power. The high frequency power supply 145 applies a high frequency voltage, for example, of 13.56 MHz, to the pair of plasma electrodes 143. Accordingly, a high frequency electric field is applied into the plasma generation space defined by the plasma compartment wall 141. The oxidizing agent gas ejected from the dispersion nozzle 123c is converted to plasma in the plasma generation space to which the high frequency electric field is applied, and is supplied into the processing chamber 101 through the opening 142, for example, in the state of a plasma gas containing oxygen radical, hydroxy radical or the like. Also, in the film forming apparatus 100, if the supply of the high frequency power to the pair of plasma electrodes 143 is stopped, the oxidizing agent gas ejected from the dispersion nozzle 123c may be supplied into the processing chamber 101 without being converted to plasma.

An insulating protective cover 146, for example made of quartz, is installed at the outside of the plasma compartment wall 141 in order to cover it. A coolant path (not shown) is installed inside the insulating protective cover 146 and may cool the plasma electrodes 143, for example, by allowing cooled nitrogen gas to flow therein.

The inert gas source 120 is connected to a nozzle 128 via a flow rate controller 121d and an opening/closing valve 122d. The nozzle 128 extends through the sidewall of the manifold 103, and ejects the inert gas from its leading end in the horizontal direction.

An evacuation opening 129 for evacuating the processing chamber 101 is installed at a sidewall portion of the processing chamber 101 opposite to the dispersion nozzles 123a to 123c. The evacuation opening 129 is formed to be narrow and long by cutting off the sidewall of the processing chamber 101 in the vertical direction. An evacuation opening cover member 130, which is formed to have a 90 degree-rotated U-shaped cross section in order to cover the evacuation opening 129, is mounted to a portion corresponding to the evacuation opening 129 of the processing chamber 101 by welding. The evacuation opening cover member 130 extends upward along the sidewall of the processing chamber 101 and defines a gas outlet 131 at an upper portion of the processing chamber 101. An evacuation unit 132, including a vacuum pump or the like, is connected to the gas outlet 131. The evacuation unit 132 evacuates the processing chamber 101 to exhaust the processing gas used in the processing and to keep a pressure required for the processing within the processing chamber 101.

A cylindrical heating unit 133 is installed around an outer periphery of the processing chamber 101. The heating unit 133 activates the gas supplied into the processing chamber 101 and simultaneously heats the objects to be processed accommodated in the processing chamber 101, the silicon substrates 1 in the example.

The control of each component of the film forming apparatus 100 is performed, for example, by a controller 150 implemented by a microprocessor (computer). A user interface 151, which includes a touch panel for input operation of commands and the like for an operator to control the film forming apparatus 100, a display for visualizing and displaying the operational status of the film forming apparatus 100, or the like, is connected to the controller 150.

A memory unit 152 is connected to the controller 150. The memory unit 152 stores a control program for implementing various kinds of processing performed in the film forming apparatus 100 by the control of the controller 150, or stores a program for performing the processing for the respective components of the film forming apparatus 100 according to processing conditions, i.e., a recipe. The recipe is stored, for example, in a storage medium of the memory unit 152. The storage medium may be a portable memory, such as a CD-ROM, DVD, or flash memory, as well as a hard disk or semiconductor memory. In addition, the recipe may be suitably transmitted from other units, for example, through a dedicated line. The recipe, if necessary, is read from the memory unit 152 by instructions or the like from the user interface 151 and the processing according to the read recipe is performed by the controller 150, so that the film forming apparatus 100 performs desired processing under the control of the controller 150.

A method of forming a silicon oxide film according to an embodiment of the present disclosure may be performed by the film forming apparatus 100 as shown in FIGS. 1 and 2. Hereinafter, the method of forming a silicon oxide film according to the embodiment of the present disclosure will be described.

THE EMBODIMENT

Method of Forming Silicon Oxide Film

FIG. 3 is a flowchart showing an example of the method of forming a silicon oxide film according to the embodiment of the present disclosure, and FIG. 4 shows sectional views illustrating a major process of the method of forming a silicon oxide film according to the embodiment.

First, as shown in Step S1 of FIG. 3, a seed layer is formed on a base, a silicon substrate (silicon wafer=silicon single crystal) in the example. An example of a method of forming a seed layer is as follows.

Figure 4A:
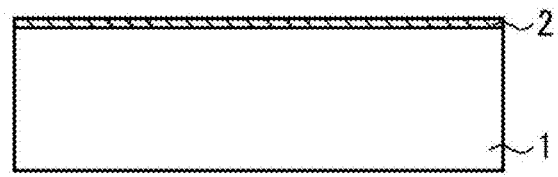
FIGS. 4A to 4D show sectional views illustrating major processes of the method of forming a silicon oxide film according to the embodiment.

As shown in FIG. 4A, silicon substrates 1 are inserted into the processing chamber 101 of the film forming apparatus 100 shown in FIGS. 1 and 2. Subsequently, the heating unit 133 in the processing chamber 101 is used to heat the silicon substrates 1. Then, a seed layer source gas, for example, an aminosilane-based gas, from the dispersion nozzle 123a flows to main surfaces of the heated silicon substrates 1. Accordingly, a silicon component contained in the aminosilane-based gas is adsorbed onto the main surface of each silicon substrate 1 to form a seed layer 2. While a specific example of the aminosilane-based gas used in forming the seed layer 2 will be described later, diisopropylaminosilane (DIPAS) was used in the example.

An example of processing conditions for forming the seed layer 2 is as follows:
DIPAS Flow Rate: 200 sccm
Processing Time: 1 min
Processing Temperature: 400 degrees C.
Processing Pressure: 133.3 Pa (1 Torr)

A process of forming the seed layer 2 is a process of facilitating adsorbing the silicon source onto the surface of the silicon substrate 1. Although it is described herein that the seed layer 2 is formed, the formation thereof is rarely performed in practice. The seed layer 2 in some embodiments has a thickness of a monoatomic layer level. Specifically, the seed layer 2 has a thickness of not less than 0.1 nm and not more than 0.3 nm.

Figure 4B:
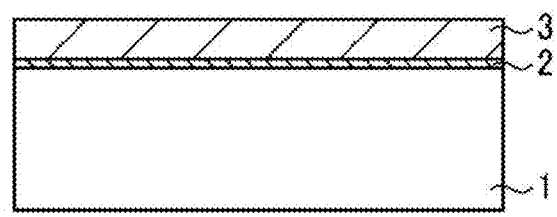

Then, as shown in Step S2 of FIG. 3 and FIG. 4B, a silicon film 3 is formed on the seed layer 2. Specifically, the silicon substrate 1 having the seed layer 2 formed thereon is continuously heated by using the heating unit 133, and a silicon source gas, for example, an amino group-free silane-based gas from the dispersion nozzle 123b, is allowed to flow to the surface of the heated silicon substrate 1. Accordingly, a silicon component contained in the amino group-free silane-based gas is deposited on the seed layer 2, and the silicon component CVD-grows to form the silicon film 3 on the seed layer 2. While a specific example of the amino group-free silane-based gas used in forming the silicon film 3 will be described later, disilane ($Si_2H_6$) was used in the example.

An example of processing conditions for forming the silicon film 3 is as follows:
$Si_2H_6$ Flow Rate: 200 sccm
Processing Time: 6 min
Processing Temperature: 400 degrees C.
Processing Pressure: 133.3 Pa (1 Torr)

Under the above processing conditions, the silicon film 3 that is an amorphous thin film having a thickness of 2 nm or so is formed. In addition, although the silicon film 3 is an amorphous silicon film in this example, the silicon film 3 may be a nanocrystalline silicon film having amorphous to nano-sized crystal grains collected, or a silicon film with amorphous silicon and nanocrystalline silicon mixed. Further, the silicon film 3 may also be a polycrystalline silicon film. However, considering "surface roughness" of a surface of a silicon oxide film that will be formed later, in some embodiments, nanocrystalline silicon is selected rather than polycrystalline silicon, amorphous-nanocrystalline mixed silicon is selected rather than nanocrystalline silicon, and amorphous silicon is selected rather than amorphous-nanocrystalline mixed silicon.

Figure 4C:
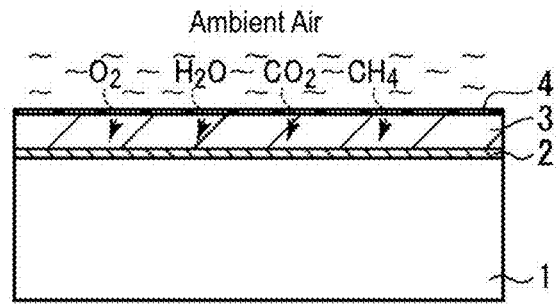
Figure 5:
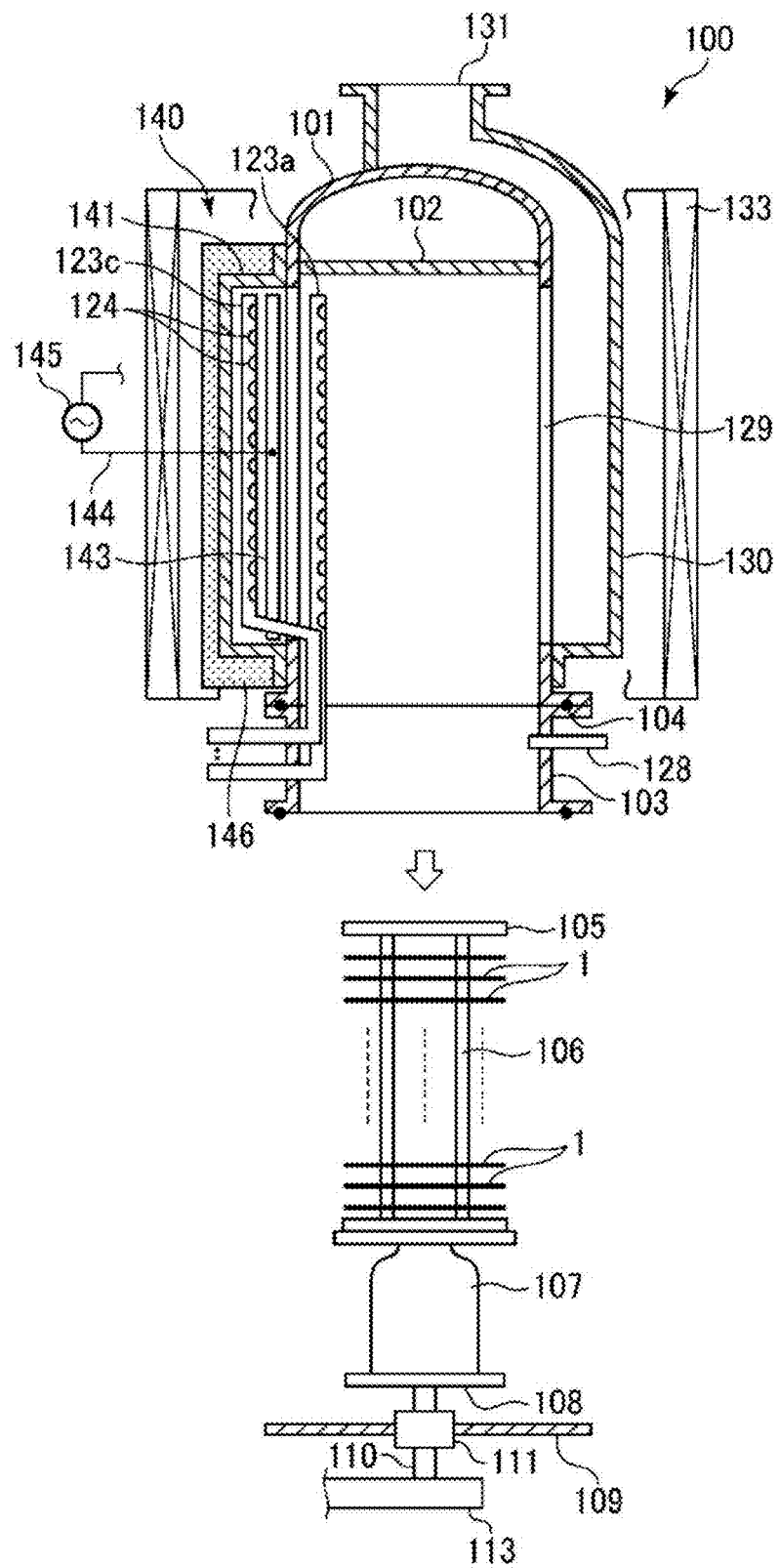
FIG. 5 is a longitudinal sectional view showing a state in which silicon substrates are taken out from a processing chamber.

Next, as shown in Step S3 of FIG. 3 and FIG. 4C, the silicon substrate 1 having the silicon film 3 formed thereon is exposed to the ambient air. Specifically, as shown in FIG. 5, the silicon substrate 1 is taken out from the inside of the processing chamber 101 to the outside thereof for each vertical type wafer boat 105. Accordingly, the silicon substrate 1 having the silicon film 3 formed thereon is exposed to the ambient air.

An example of processing conditions for the exposure to the ambient air is as follows:
Processing Time: 1 to 600 min
Processing Temperature Room Temperature (for example 25 degrees C.)
Processing Pressure Ambient Air Pressure Here, the major components of the ambient air are as follows (cited from ISO2533:1975):
Nitrogen ($N_2$): 78.084% by volume
Oxygen ($O_2$): 20.948% by volume
Carbon Dioxide ($CO_2$): 0.036% by volume
Methane ($CH_4$): 0.0002% by volume (2 ppm)

In addition, the other components will be omitted in this description.

In the real ambient air, about 0.5% by volume of water vapor ($H_2O$) is added to these components (when the dry ambient air is not used).

The silicon film 3 immediately after being formed is not a film whose state is dense, solid and stable. Accordingly, if the silicon film 3 immediately after its formation is exposed to the ambient air, the components of the ambient air may permeate the silicon film 3. That is, when the silicon film 3 immediately after its formation is exposed to the ambient air, a small amount of oxidizing components contained in the ambient air, for example, a small amount of oxygen or water vapor of about 21% by volume is introduced into the silicon film 3. It is understood that most of the introduced oxygen or water vapor exists as it is when being introduced into the silicon film 3, while a portion thereof is combined with silicon to allow extremely weak initial oxidation to occur in the silicon film 3. In addition, carbon dioxide or compounds of carbon and hydrogen, for example, organic components such as methane, which are contained in an extremely tiny amount in the ambient air, are also introduced into the silicon film 3.

Also, when the silicon film 3 is exposed to the ambient air, a thin natural oxide film 4 is formed on the surface of the silicon film 3 as shown in FIG. 4C, i.e., the surface of the silicon film 3 is coated with the thin natural oxide film 4.

As described above, in the embodiment, the silicon substrate 1 is taken out from the inside of the processing chamber 101 and exposed to the ambient air, and carbon dioxide or compounds of carbon and hydrogen, for example, organic components such as methane, are previously introduced into the silicon film 3 before oxidation, in addition to the oxidizing components such as oxygen or water vapor. In addition, the surface of the silicon film 3 is coated with the natural oxide film 4. The oxidizing components, carbon dioxide and compounds of carbon and hydrogen, for example, organic components such as methane, are introduced into the silicon film 3, and simultaneously, the silicon film 3 is coated with the thin natural oxide film 4. Thereafter, the silicon substrate 1 is returned again to the inside of the processing chamber 101.

Figure 4D:
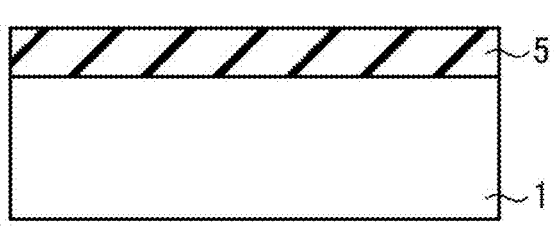

Next, as shown in Step S4 of FIG. 3 and FIG. 4D, the silicon film 3 exposed to the ambient air and the seed layer 2 are oxidized to form a silicon oxide film 5 on the silicon substrate 1. Specifically, the silicon substrate 1 having the silicon film 3 exposed to the ambient air is heated using the heating unit 133, and the gas containing the oxygen radical or hydroxy radical generated by the plasma generation unit 140 is supplied to the surface of the heated silicon substrate 1 inside the processing chamber 101 through the opening 142.

An example of processing conditions for forming the silicon oxide film 5 is as follows:

Oxidation Method: Depressurization Radical Oxidation Method

Oxidizing Agent Gas: $O_2/H_2$

Oxidation Time: 30 min

Oxidation Temperature: 600 degrees C.

Processing Pressure: 133.3 Pa (1 Torr)

(Improvement of Interface Roughness)

Figure 6:
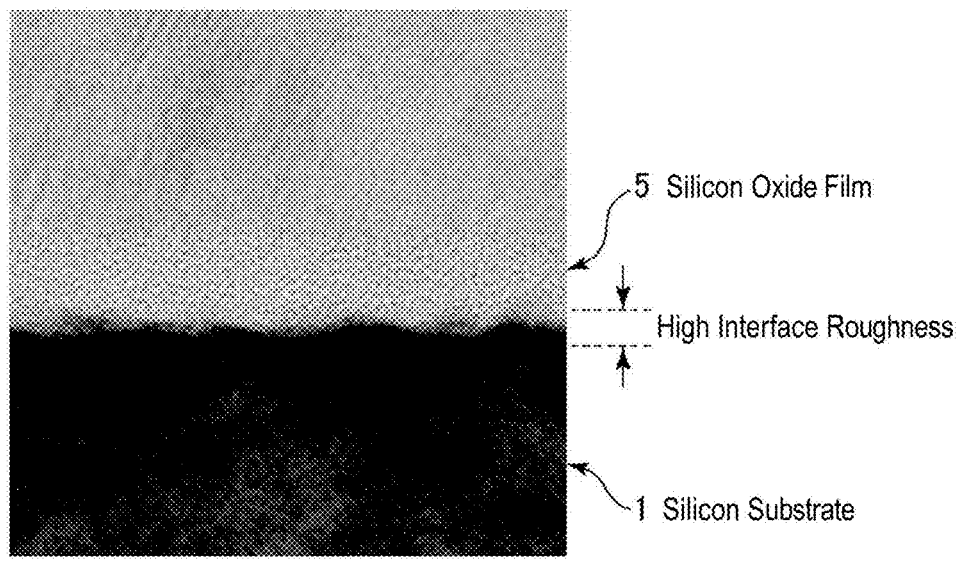
FIG. 6 is a photograph showing a cross section of a silicon oxide film formed by a method of forming a film according to a reference example.
Figure 7:
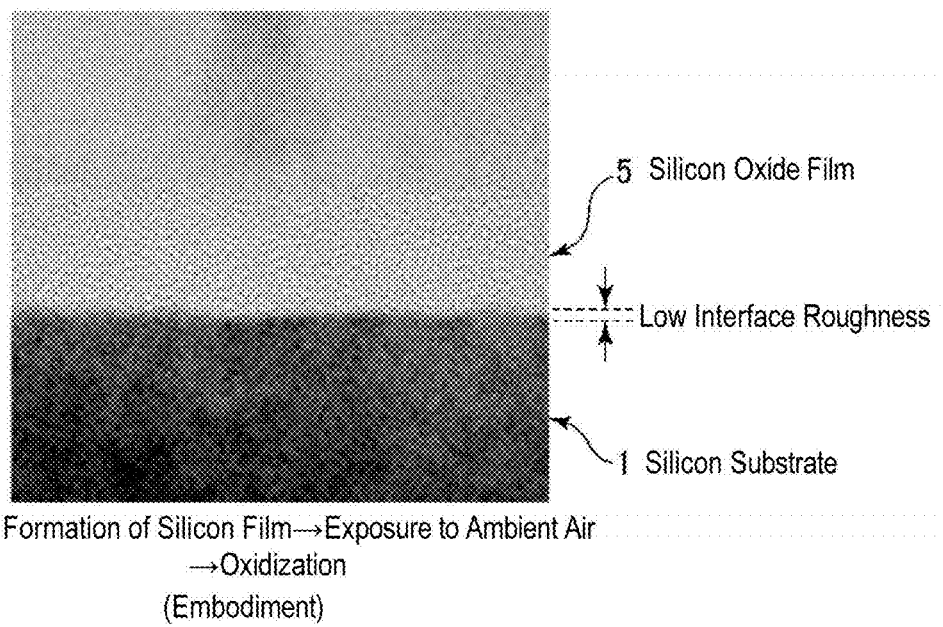
FIG. 7 is a photograph showing a cross section of a silicon oxide film formed by the method of forming a silicon oxide film according to the embodiment.

Interface roughness between the silicon substrate 1 and the silicon oxide film 5 thus formed was measured. FIG. 6 is a photograph (transmission electron photomicrograph) showing a cross section of a silicon oxide film 5 formed by a method of forming a film according to a reference example, and FIG. 7 is a photograph (transmission electron photomicrograph) showing a cross section of a silicon oxide film 5 formed by a method of forming a silicon oxide film 5 according to the embodiment of the present disclosure.

REFERENCE EXAMPLE

As shown in FIG. 6, when the silicon film 3 is formed and then the silicon oxide film 5 is formed by consecutively oxidizing the silicon film 3 in the same processing chamber, the interface roughness at the interface between the silicon oxide film 5 and the silicon substrate 1 is high.

EMBODIMENT OF THE PRESENT DISCLOSURE

On the contrary, as shown in FIG. 7, when the silicon film 3 is formed and exposed to the ambient air and then the silicon oxide film 5 is formed by oxidizing the silicon film 3, the interface roughness is low as compared with the reference example shown in FIG. 6.

Such an improvement of interface roughness may be inferred as follows.

According to the method of forming a silicon oxide film of the embodiment, the silicon film 3 is exposed to the ambient air before oxidization. Accordingly, oxidizing components (oxygen or water vapor contained in the ambient air in an amount of about 21% by volume), carbon dioxide (contained in the ambient air in an amount of about 0.03 to 0.04% by volume) and compounds of carbon and hydrogen, for example organic components such as methane (methane being contained in the air in an amount of about 2 ppm=0.0002% by volume) are introduced into the film.

That is, at the time of initiating the oxidation, a tiny amount of oxidizing components is previously introduced into the film. Accordingly, from an early stage of initiating the oxidation, the oxidation proceeds on the surface of the silicon film 3, the inside of the film and the interface of the silicon film 3 with the silicon substrate 1. For example, when the oxidation proceeds in one direction, i.e., from the surface of the silicon film 3 toward the interface thereof with the silicon substrate 1, the oxidizing agent permeates the silicon film 3 in a so-called "wedge shape". For this reason, during the oxidation, a physical force tending to expand the silicon film 3 is applied to a deep portion (the vicinity of the interface) of the silicon film 3 where the oxidation does not yet proceed. As a result, the silicon film 3 in the vicinity of the interface comes to a state in which migration (i.e., separation of silicon atoms from each other) easily occurs.

On the contrary, if the oxidation is allowed to proceed on the surface, inside, and interface of the silicon film 3, a physical force is applied to the inside of the silicon film 3 with more uniformity throughout the entire region of the silicon film 3 as compared with a case where the oxidation proceeds in one direction only from the surface. As a result, circumstances difficult to allow the migration to occur in the vicinity of the interface may be provided to the silicon film 3. Since it is difficult for the migration to occur in the silicon film 3 as described above, it is possible to improve the interface roughness.

The silicon oxide film 5 formed by oxidizing the silicon film 3 has low interface roughness with its base. The silicon oxide film 5 having low interface roughness makes it difficult for interface states to be generated in the interface between the base, i.e., the silicon substrate 1 in the example, and the silicon oxide film 5. Thus, since it is rare for mobility of electrons or holes to deteriorate or for electrical charges to be trapped, the silicon oxide film 5 having stable electronic properties can be obtained. Therefore, it is possible to obtain an advantage in that the silicon oxide film 5 suitable for application to electronics, for example semiconductor integrated circuit devices, can be obtained.

In addition, functions caused by the introduction of the organic components such as an extremely tiny amount of methane into the silicon film 3 may be inferred as follows.

For example, if methane ($CH_4$) reacts with the hydroxy radical (OH), the methane ($CH_4$) is decomposed into water ($H_2O$) and a methyl group ($CH_3$). In addition, energy such as heat and/or high frequency electric field is applied during oxidation. Accordingly, a hydrogen atom is separated from the methyl group ($CH_3$), so that a methylene group ($CH_2$) may be produced. If the methyl group or methylene group reacts with silicon (Si) inside the silicon film 3, an organic silicon compound is produced. If there are silicon atoms with broken bonds, for example, by application of a physical force, the methyl group or methylene group may serve to connect them again into an organic silicon compound. Such a phenomenon has a function of inhibiting the migration from occurring in the silicon film 3.

Further, when the silicon film 3 is formed into an amorphous state, the amorphous silicon film 3 contains hydrogen atoms therein. When the silicon film 3 is oxidized, the temperature inside the processing chamber 101 is raised to the oxidation temperature. Accordingly, inside the amorphous silicon film 3, bonds between hydrogen atoms and silicon atoms are broken to result in separation of the hydrogen atoms. In the amorphous silicon film 3 with the separated hydrogen atoms, the silicon atoms move toward the separated hydrogen atoms. This is also one of the causes of the migration in the silicon film 3.

Regarding the migration in the silicon film 3 caused by the hydrogen atoms separated as described above, if the hydrogen atoms separated from the compounds containing carbon and hydrogen, e.g., organic components such as methane, a methyl group, a methylene group and the like exist inside the silicon film 3, the separated hydrogen atoms may be bonded to each other. Accordingly, it is also advantageous in that the migration in the silicon film 3 caused by the separation of the hydrogen atoms, which may occur in the amorphous silicon film 3, can also be efficiently suppressed.

Also, even though the organic silicon compound is produced, there is no problem if it can be changed into the silicon oxide by the oxidation. In addition, water ($H_2O$) and the like produced from the decomposition of the organic components becomes an oxidizing agent in the silicon film 3, thereby serving to promote the oxidation inside the silicon film 3.

Further, the introduced carbon dioxide ($CO_2$) is a stable substance. Accordingly, although it is difficult to expect remarkable change, it may be considered that carbon dioxide is separated into carbon (C) and oxygen ($O_2$) in the plasma generation space to which strong energy is applied. If carbon dioxide is separated into carbon (C) and oxygen ($O_2$), the carbon serves to connect bond-broken silicon atoms with one another again into silicon carbide in the same way as the methyl group or methylene group did. Of course, even though the silicon carbide is produced, there is no problem if it is changed into the silicon oxide by the oxidation, in the same way as the organic silicon compound. In addition, since oxygen also becomes an oxidizing agent inside the silicon film 3, so that it is possible to obtain a function of promoting the oxidation inside of the silicon film 3.

However, a large amount of carbon may be a cause of deterioration of insulation properties of the silicon oxide film 5. Accordingly, the oxidation may be performed on a condition where the carbon dioxide is not decomposed.

Also, carbon dioxide may be removed from the ambient air atmosphere used in the exposure to the ambient air.

In addition, since the silicon film 3 is exposed to the ambient air in the method of forming a silicon oxide film of the embodiment, the surface of the silicon film 3 is coated with the thin natural oxide film 4. The thin natural oxide film 4 applied to the silicon film 3 functions as a so-called buffer layer for preventing the oxidizing agent from radically penetrating into the silicon film 3 and for preventing the oxidation from rapidly occurring in the surface. For example, if the silicon film 3 immediately after its formation is oxidized in a state in which the surface of the silicon film 3 is bare silicon, the oxidizing agent radically penetrates into the silicon film 3 and there is rapid surface oxidation. The radical penetration of the oxidizing agent or the rapid oxidation on the surface may be a factor which enables applying a larger physical force to the silicon film 3 in the vicinity of the interface in which the oxidation does not proceed. Accordingly, this may result in a state in which the migration easily occurs in the silicon film 3.

In this regard, according to the embodiment in which the surface of the silicon film 3 is coated with the thin natural oxide film 4, it is possible to inhibit both the radical penetration of the oxidizing agent into the silicon film 3 and the rapid oxidation on the surface thereof. Therefore, it is possible to further reduce the possibility for the migration to occur in the silicon film 3 as compared with a case where the surface of the silicon film 3 is not coated with the thin natural oxide film 4.

(Improvement of Surface Roughness)

Figure 8:
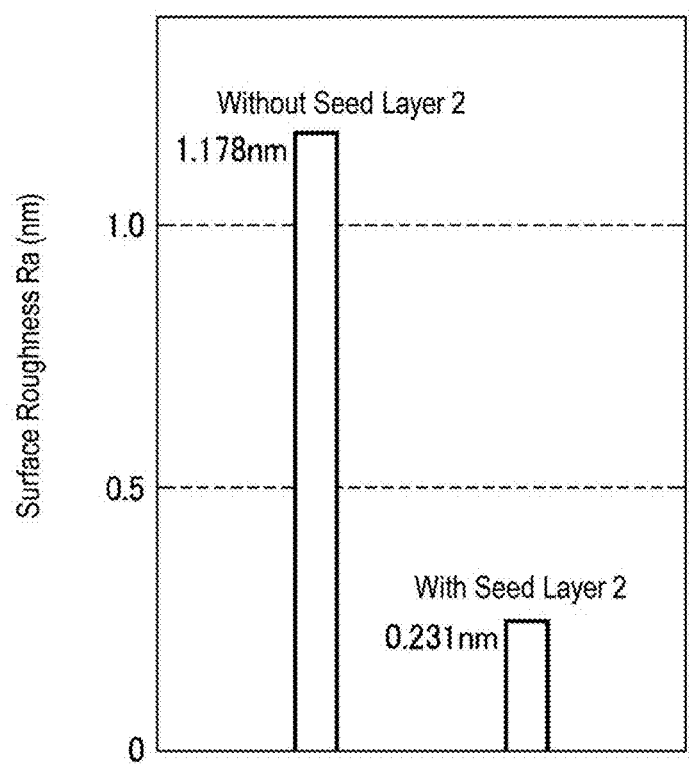
FIG. 8 is a view showing measurement results of surface roughness.

Next, an improvement of surface roughness of the silicon oxide film 5 will be described. The improvement of surface roughness is an advantage obtained from the seed layer 2, which is formed before the silicon film 3 is formed. The measurement results of the surface roughness Ra are shown in FIG. 8. FIG. 8 shows surface roughness Ra of a silicon oxide film 5 where the seed layer 2 is not formed (Without Seed Layer) and surface roughness Ra of a silicon oxide film 5 where the seed layer 2 is formed (With Seed Layer).

As shown in FIG. 8, the silicon oxide film 5 without the seed layer had a surface roughness Ra of 1.178 nm. On the contrary, the silicon oxide film 5 with the seed layer had a surface roughness Ra of 0.231 nm.

As the seed layer 2 is formed on the surface of the base before the silicon film 3 is formed as described above, it is possible to also obtain the silicon oxide film 5 having satisfactory surface roughness.

Also, a method of measuring the surface roughness $R^a$ is as follows.

Measuring Device: Atomic Force Microscope (AFM)
Measurement Range: 1 μm×1 μm
Roughness: Average Surface Roughness Ra In addition, the embodiment may be modified as follows.

(Modification of Seed Layer Source Gas)

The aminosilane-based gas, as the seed layer source gas, includes BAS (butylaminosilane), BTBAS (bis(tert-butylamino)silane), DMAS (dimethylaminosilane), BDMAS (bis(dimethylamino)silane), TDMAS (tri(dimethylamino)silane), DEAS (diethylamino silane), BDEAS (bis(diethylamino)silane), DPAS (dipropylaminosilane), and DIPAS (diisopropylaminosilane).

Also, a high order silane-based gas may be used as the seed layer source gas.

The high order silane-based gas may include trisilane or higher order silane-based gases. An example of the trisilane or higher order silane-based gas includes silicon hydrides represented by formula $Si_mH_{2m+2}$ (wherein m is a natural number not less than 3) and silicon hydrides represented by formula $Si_nH_2$ (wherein n is a natural number not less than 3).

The silicon hydride represented by formula $Si_mH_{2m+2}$ (wherein m is a natural number not less than 3) may specifically include gases including at least one of trisilane ($Si_3H_8$), tetrasilane ($Si_4H_{10}$), pentasilane ($Si_5H_{12}$), hexasilane ($Si_6H_{14}$), and heptasilane ($Si_7H_{16}$).

Also, the silicon hydride represented by the formula $Si_nH_{2n}$ (wherein n is a natural number not less than 3) may specifically include gases including at least one of cyclotrisilane ($Si_3H_6$), cyclotetrasilane ($Si_4H_8$), cyclopentasilane ($Si_5H_{10}$), cyclohexasilane ($Si_6H_{12}$), and cycloheptasilane ($Si_7H_{14}$).

In addition, a chlorosilane-based gas may also be used as the seed layer source gas.

An example of the chlorosilane-based gas may include silicon hydrides represented by the formula $Si_mH_{2m+2}$ (wherein m is a natural number not less than 1) having at least one of hydrogen atoms substituted by a chlorine atom.

The silicon hydride represented by the formula $Si_mH_{2m+2}$ (wherein m is a natural number not less than 1) having at least one of the hydrogen atoms substituted by a chlorine atom may specifically include gases including at least one of monochlorosilane ($SiH_3Cl$), dichlorosilane ($SiH_2Cl_2$), monochlorodisilane ($Si_2H_5Cl$), dichlorodisilane ($Si_2H_4Cl_2$), tetrachlorodisilane ($Si_2H_2Cl_4$), hexachlorodisilane ($Si_2Cl_6$), and octachlorotrisilane ($Si_3Cl_8$).

Also, the chlorosilane-based gas may include silicon hydrides represented by the formula $Si_nH_{2n}$ (wherein n is a natural number not less than 2) having at least one of hydrogen atoms substituted by a chlorine atom.

The silicon hydride represented by the formula $Si_nH_{2n}$ (wherein n is a natural number not less than 2) having at least one of the hydrogen atoms substituted by a chlorine atom may specifically include gases including at least one of monochlorodisilene ($Si_2H_3Cl$), dichlorodisilene ($Si_2H_2Cl_2$), monochlorocyclotrisilane ($Si_3H_5Cl$), and dichlorocyclotrisilane ($Si_3H_4Cl_2$).

When a chlorosilane-based gas is used, there is an advantage, for example, in that carbon contamination which deteriorates insulation properties can be prevented since the chlorosilane-based gas is an inorganic silicon source containing no carbon, similarly to the high order silane-based gas.

In addition, the chlorosilane-based gas allows silicon atoms to be adsorbed onto the base at high density as compared with the high order silane-based gas.

Further, aminosilane-based gases containing two or more silicon atoms in a molecular formula of an aminosilane-based gas may be used as the aminosilane-based gas that is the seed layer source gas. An example of the aminosilane-based gas containing two or more silicon atoms in a molecular formula may include amino silicon compounds represented by the following formulas:

$$((R1R2)N)_nSi_XH_{2X+2-n-m}(R3)_m \quad (A) \text{ or}$$

$$((R1R2)N)_nSi_XH_{2X-n-m}(R3)_m \quad (B),$$

wherein in Formulas (A) and (B),
n is the number of amino groups ranging from 1 to 6,
m is the number of alkyl groups ranging from 0 to 5,
R1 and R2 are each independently selected from the group consisting of $CH_3$, $C_2H_2$, and $C_3H_7$,
R3 is independently selected from the group consisting of $CH_3$, $C_2H_2$, $C_3H_7$, Cl, and F, and
X is a number not less than 2.

A specific example of the aminosilane-based gas represented by Formula (A) may include, for example, gases including at least one of hexakisethylaminodisilane ($Si_2H_6N_6(Et)_6$), diisopropylaminodisilane ($Si_2H_5N(iPr)_2$), diisopropylaminotrisilane ($Si_3H_7N(iPr)_2$), diisopropylaminodichlorosilane ($Si_2H_4ClN(iPr)_2$), and diisopropylaminotrichlorosilane ($Si_3H_6ClN(iPr)_2$).

Chlorine (Cl) may also be substituted by fluorine (F).

In addition, a specific example of the aminosilane-based gas represented by Formula (B) may include, for example, gases including at least one of diisopropylaminodisilene ($Si_2H_3N(iPr)_2$), diisopropylaminocyclotrisilane ($Si_3H_5N(iPr)_2$), diisopropylaminodichlorodisilene ($Si_2H_2ClN(iPr)_2$), and diisopropylaminodichlorocyclotrisilane ($Si_3H_4ClN(iPr)_2$). Chlorine (Cl) may also be substituted by fluorine (F).

As described above, the aminosilane-based gas that is the source gas of the seed layer 2 may be selected from gases including at least one of the aminosilane-based gas, the trisilane or higher order silane-based gas, the chlorosilane-based gas, and the aminosilane-based gases containing two or more silicon atoms in a molecular formula.

(Modification of Silicon Film Source Gas)

As the amino group-free silane-based gas that is the silicon film source gas, monosilane ($SiH_4$) and disilane ($Si_2H_6$) may be used.

Also, the aminosilane-based gas may be used as the silicon film source gas. An example of the aminosilane-based gas may include the above-described aminosilane-based gases.

Further, in case the aminosilane-based gas may be used as the silicon film source gas, it is preferred in some embodiments to form the seed layer 2 using, e.g., the trisilane or higher order silane-based gas.

Also, when the silicon film 3 is formed using monosilane ($SiH_4$) gas as the silicon film source gas, disilane ($Si_2H_6$) or higher order silane-based gases may be used as the seed layer source gas.

The chlorosilane-based gas may also be used as the silicon film source gas. An example of the chlorosilane-based gas may include silicon hydrides represented by the formula $Si_mH_{2m+2}$ (wherein m is a natural number not less than 1) having at least one of the hydrogen atoms substituted by a chlorine atom, similarly to the seed layer source gas. The chlorosilane-based gas may include the above-described chlorosilane-based gases.

In addition, the chlorosilane-based gas may include silicon hydrides represented by the formula $Si_nH_{2n}$ (wherein n is a natural number not less than 1) having at least one of the hydrogen atoms substituted by a chlorine atom.

The chlorosilane-based gas is an inorganic silicon source, similar to the silane-based gas. Accordingly, it is possible to obtain an advantage in that carbon contamination into the silicon film 3 being formed can be prevented. Further, deterioration of insulation properties can be well inhibited in the silicon oxide film 5 that is formed by oxidizing the silicon film 3 as compared with a case where the silicon film 3 is formed without using an inorganic silicon source.

As described above, the source gas of the silicon film 3 may be selected from gases including at least one of a disilane or lower order silane-based gas, an aminosilane-based gas and a chlorosilane-based gas.

(Modification of Exposure to Ambient Air)

In the embodiment, the silicon substrate 1 having the silicon film 3 formed thereon is taken out from the processing chamber 101 and exposed to the ambient air. However, instead of taking out the silicon substrate 1 from the processing chamber 101, an ambient air atmosphere may be introduced into the processing chamber 101 with the silicon substrate 1 accommodated therein.

When the ambient air atmosphere is introduced into the processing chamber 101, it is preferred in some embodiments to introduce highly clean ambient air atmosphere, for example, with metal particles, sodium and the like sufficiently removed in order to prevent the inside of the processing chamber 101 from being contaminated.

Also, instead of the ambient air, a so-called artificial ambient air atmosphere similar to the ambient air is prepared, and the silicon substrate 1 having the silicon film 3 formed thereon may be exposed to the artificial ambient air atmosphere, or the processing chamber 101 may be supplied with the artificial ambient air atmosphere. An example of the artificial ambient air atmosphere includes about 80% by volume of nitrogen ($N_2$) gas and about 20% by volume of oxygen ($O_2$) gas. About 0.0002% or so by volume (2 ppm) of a gas containing organic components may be added to the artificial ambient air atmosphere. The added gas containing organic components includes, for example, methane ($CH_4$) gas.

In addition, as for a volumetric ratio of nitrogen gas to oxygen gas of the artificial ambient air atmosphere, the volumetric ratio may be adjustable as long as it is substantially similar to that of the ambient air. The ratio is not limited to about 8:2. A range of the volumetric ratio of nitrogen gas to oxygen gas which guarantees the above-described advantages, is, for example, between about 9:1 and about 7:3 in practical aspects. Such an atmosphere may contain, for example, about 0.0002% by volume (2 ppm) of a gas containing organic components, such as methane gas. Of course, the mixing percentage of the gas containing organic components is not limited to about 0.0002% by volume (2 ppm), either. A range of the mixing percentage of the gas containing organic components which guarantees the above-described advantages, is between about 0.0001% by volume and about 0.0003% by volume (about 1 ppm and about 3 ppm) in practical aspects.

(Suitable Range of Processing Temperature in Forming Seed Layer)

A suitable range of processing temperature in forming the seed layer is not less than 300 degrees C. and not more than 600 degrees C.

(Suitable Range of Processing Pressure in Forming Seed Layer)

A suitable range of processing pressure in forming the seed layer is not less than 13.3 Pa (0.1 Torr) and not more than 665 Pa (5 Torr).

(Suitable Range of Flow Rate of Seed Layer Source Gas)

A suitable range of flow rate of the seed layer source gas is not less than 10 sccm and not more than 500 sccm.

(Modification of Oxidation Process)

In the embodiment, a depressurization radical oxidation method is used in the oxidation process of Step S4. The oxidation method is not limited to the depressurization radical oxidation method and includes, for example, a plasma oxidation method, in which an oxidizing agent gas is converted to plasma, or a heat oxidation method without using plasma. In addition, an ozone oxidation method using ozone as the oxidizing agent, a wet oxidation method using water vapor as the oxidizing agent, or the like may be used.

Also, although the mixed atmosphere of oxygen ($O_2$) gas and hydrogen ($H_2$) gas is used as the oxidizing agent gas, oxygen ($O_2$) gas, ozone ($O_3$) gas, dinitrogen monoxide ($N_2O$) gas, or nitrogen monoxide (NO) gas may be used.

Hereinabove, while the present disclosure has been described with reference to the embodiment, the present disclosure is not limited to the embodiment but may be variously modified within the scope of this disclosure without departing from the spirit thereof. Also, as an embodiment of the present disclosure, the above-described embodiment is not a sole embodiment.

For example, although the processing conditions have been specifically exemplified in the above-described embodiment, the processing conditions are not limited to the above specific examples.

Also, while the silicon substrate 1 has been exemplified as the base, the base is not limited to the silicon substrate 1. For example, the base may be a silicon nitride film or a polycrystalline silicon film. Of course, the base may be a metal film, such as a tungsten or copper film, for example, forming an inner wiring layer. Further, the base may be a dielectric film having a relative dielectric constant higher than that of a silicon oxide film, such as a tantalum oxide film, which for example, is used as a dielectric film of a capacitor or the like.

In addition, regarding how deeply the oxidation proceeds in the thickness direction, it is preferred in some embodiments to oxidize all the silicon film 3 and the seed layer 2. This is to avoid leaving non-oxidized portions in the silicon film 3 or the seed layer 2.

Also, when the base is a material easily oxidized such as the silicon substrate 1, after all the silicon film 3 and the seed layer 2 are oxidized, the oxidation may also proceed up to the base, for example, up to the silicon substrate 1, if necessary. Even when the oxidation proceeds up to the base as described above, satisfactory interface roughness can be obtained.

According to the present disclosure, it is possible to provide a method of forming a silicon oxide film, allowing for a silicon oxide film having satisfactory interface roughness.

In addition, the present disclosure may be modified within the scope of this disclosure without departing from the spirit thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon oxide film, comprising:
   forming a silicon film on a surface of a substrate to be processed;
   supplying an artificial ambient air atmosphere containing nitrogen gas, oxygen gas, and methane gas into a processing chamber with the substrate on which the silicon film is formed accommodated within the processing chamber to form a thin natural oxide film on the silicon film and to introduce the oxygen gas and the methane gas into the silicon film; and
   oxidizing the silicon film into which the oxygen gas and the methane gas are introduced and the thin natural oxide film using a depressurization radical oxidation method to form a silicon oxide film,
   wherein, in oxidizing the silicon film and the thin natural oxide film, the methane gas introduced into the silicon film reacts with a hydroxy radical generated by a plasma generation unit to be decompressed into a water and a methyl group.

2. The method of claim 1, wherein nitrogen gas and oxygen gas in the artificial ambient air atmosphere are mixed at a volumetric ratio of nitrogen gas to oxygen gas ranging from 9:1 to 7:3.

3. The method of claim 2, wherein the artificial ambient air atmosphere contains 1 ppm to 3 ppm of the methane gas.

4. The method of claim 1, wherein the forming a silicon film comprises:
forming a seed layer on the substrate; and
forming the silicon film on the seed layer.

5. The method of claim 4, wherein the seed layer is formed by adsorbing at least one of an aminosilane-based gas, a trisilane or higher order silane-based gas, a chlorosilane-based gas, and an aminosilane-based gas containing two or more silicon atoms in a molecular formula onto the substrate.

6. The method of claim 4, wherein the silicon film is formed by supplying a gas containing at least one of a disilane or lower order silane-based gas, an aminosilane-based gas, and a chlorosilane-based gas onto the seed layer.

7. The method of claim 5, wherein the aminosilane-based gas is selected from gases comprising at least one of:
BAS (butylaminosilane),
BTBAS (bis(tert-butylamino)silane),
DMAS (dimethylaminosilane),
BDMAS (bis(dimethylamino)silane),
TDMAS (tri(dimethylamino)silane),
DEAS (diethylamino silane),
BDEAS (bis(diethylamino)silane),
DPAS (dipropylaminosilane), and
DIPAS (diisopropylaminosilane).

8. The method of claim 5, wherein the trisilane or higher order silane-based gas comprises at least one of:
silicon hydrides represented by the formula $Si_mH_{2m+2}$ (wherein m is a natural number not less than 3); and
silicon hydrides represented by the formula $Si_nH_{2n}$ (wherein n is a natural number not less than 3).

9. The method of claim 5, wherein the chlorosilane-based gas comprises at least one of:
silicon hydrides represented by the formula $Si_mH_{2m+2}$ (wherein m is a natural number not less than 1) having at least one of hydrogen atoms substituted by a chlorine atom; and
silicon hydrides represented by the formula $Si_nH_{2n}$ (wherein n is a natural number not less than 2) having at least one of hydrogen atoms substituted by a chlorine atom.

10. The method of claim 5, wherein the aminosilane-based gas containing two or more silicon atoms in a molecular formula comprises at least one of amino silicon compounds represented by the following formulas:

$$((R1R_2)_N)_nSi_xH_{2X+2-n-m}(R3)_m, \text{ and}$$

$$((R1R2)N)_nSi_xH_{2X-n-m}(R3)_m,$$

wherein n is the number of amino groups ranging from 1 to 6,
m is the number of alkyl groups ranging from 0 to 5,
R1 and R2 are each independently selected from the set consisting of $CH_3$, $C_2H_5$ and $C_3H_7$,
R3 is independently selected from the set consisting of $CH_3$, $C_2H_5$, $C_3H_7$,
Cl, and F, and
X is a number not less than 2.

11. The method of claim 6, wherein the disilane or lower order silane-based gas is selected from gases comprising at least one of:
monosilane ($SiH_4$), and
disilane ($Si_2H_6$).

12. The method of claim 6, wherein the aminosilane-based gas is selected from gases comprising at least one of:
BAS (butylaminosilane),
BTBAS (bis(tert-butylamino)silane),
DMAS (dimethylaminosilane),
BDMAS (bis(dimethylamino)silane),
TDMAS (tri(dimethylamino)silane),
DEAS (diethylamino silane),
BDEAS (bis(diethylamino)silane),
DPAS (dipropylaminosilane), and
DIPAS (diisopropylaminosilane).

13. The method of claim 6, wherein the chlorosilane-based gas comprises at least one of:
silicon hydrides represented by the formula $Si_mH_{2m+2}$ (wherein m is a natural number not less than 1) having at least one of hydrogen atoms substituted by a chlorine atom; and
silicon hydrides represented by the formula $Si_nH_{2n}$ (wherein n is a natural number not less than 2) having at least one of hydrogen atoms substituted by a chlorine atom.

* * * * *